United States Patent

Lee et al.

[11] Patent Number: 5,887,013
[45] Date of Patent: Mar. 23, 1999

[54] LIGHT EMITTING APPARATUS

[75] Inventors: Geum-hee Lee, Seoul; Hyun-kuk Shin, Suwon; Yong-hee Lee, Daejeon, all of Rep. of Korea

[73] Assignee: Samsung Electronics Co., Ltd., Kyungki-Do, Rep. of Korea

[21] Appl. No.: 919,199

[22] Filed: Aug. 28, 1997

[30] Foreign Application Priority Data

Oct. 29, 1996 [KR] Rep. of Korea ............ 96-49775

[51] Int. Cl.⁶ ............................ H01S 3/19; H01S 3/08
[52] U.S. Cl. .................................... 372/50; 372/96
[58] Field of Search .......................... 372/50, 43, 96; 257/84, 85

[56] References Cited

U.S. PATENT DOCUMENTS

| | | | |
|---|---|---|---|
| 5,136,603 | 8/1992 | Hasnain et al. | 372/50 |
| 5,574,744 | 11/1996 | Gaw et al. | 372/50 |
| 5,577,064 | 11/1996 | Swirhun et al. | 372/96 |
| 5,606,572 | 2/1997 | Swirhun et al. | 372/50 |
| 5,757,837 | 5/1998 | Lim et al. | 372/50 |

*Primary Examiner*—Rodney Bovernick
*Assistant Examiner*—Quyen Phan Leung
*Attorney, Agent, or Firm*—Sughrue, Mion, Zinn, Macpeak & Seas, PLLC

[57] ABSTRACT

A light emitting apparatus having a surface emitting laser including a substrate, a first reflection layer, an active layer and a second reflection layer stacked successively on the substrate, first and second electrodes formed respectively on the lower surface of the substrate and a portion of the upper surface of the second reflective layer, to emit light in the direction of the stacked layers, and a monitoring photodetector stacked on the second reflection layer to detect the amount of the emitted light from the surface emitting laser, is provided. The monitoring photodetector includes first semiconductor material layer, an absorbing layer and second semiconductor material layer stacked successively on the second reflection layer, a third electrode formed on the second semiconductor layer to output detecting signals of the monitoring photodetector, and a controlling layer formed on the bottom of the absorbing layer to intercept some of the incident light.

6 Claims, 2 Drawing Sheets

LIGHT EMITTING APPARATUS

BACKGROUND OF THE INVENTION

The present invention relates to a light emitting apparatus, and specifically to a light emitting apparatus employing a surface emitting laser (SEL) with improved light emitting characteristics.

In general, a semiconductor laser including an edge emitting laser and a SEL is widely used as a small light emitting apparatus. The amount of light emitted from the semiconductor laser must be maintained at a constant level and a monitoring photodetector is used for this purpose.

Since the SEL emits light in the direction of stacked semiconductor layers, several SEL's can be integrated onto a single substrate. In addition, because the shape of the SEL beam is nearly circular and the light intensity shows a Gaussian distribution, there is no need to provide an additional optical device to correct the shape of the emitted light. Therefore, the SEL is widely used as a light emitting apparatus in various technical fields, such as computers, audio/video devices, laser printers, laser scanners, medical devices, and communication systems.

However, since one of the light emitting surfaces of the SEL is combined with the top face of a substrate, installing a monitoring photodetector is not easy.

Accordingly, research into making a photodetector and a SEL of a single body has been actively conducted.

As illustrated in FIG. 1, a conventional light emitting apparatus is composed of a SEL 20 that emits light in the direction of the stacked layers, and a monitoring photodetector 50 disposed on top of the SEL 20, in which the photodetector and the SEL are formed of a single body.

The SEL 20 is comprised of a substrate 1, an active layer 23 which is formed on the substrate 1 and emits light, first and second reflection layers 22 and 27, which are made by stacking semiconductor compounds alternately on the top and the bottom faces of the active layer 23 and which resonate the light emitted from the active layer 23, a high resistance portion 25 formed by injecting ions or protons into the region except for the center portion 23a of the active layer 23, a window 29 for the transmission of light on top of the monitoring photodetector 50, and first and second electrodes 10 and 30 formed on the bottom surface of the substrate 1 and the top surface of the second reflection layer 27, respectively.

When the first and the second electrodes 10 and 30 are biased in the positive direction, an electric current flows through the center portion 23a of the active layer 23 by the high resistance portion 25 and light is produced by combination of electrons and positive holes. Only the light of a wavelength sufficient for resonance condition of the first and the second reflection layers 22 and 27 remains among the produced light, and the light is amplified by the stimulated emission of light having the same phase and wavelength in the active layer 23 by the remaining light. The laser beam produced by the stimulated emission emits light towards the top and bottom surfaces of the SEL 20.

The SEL 20 emits not only the stimulated emitted light but also the spontaneously emitted light, which is a mixed light of several wavelengths and different phases and has a characteristic different from that of the stimulated emission light.

The monitoring photodetector 50 includes a pair of different type impurity semiconductor material layers 51 and 58, an intrinsic semiconductor material layer 57 disposed between these impurity semiconductor layers 51 and 58, and a third electrode 70 for outputting signals detected in the monitoring photodetector 50. The monitoring photodetector absorbs some of the light emitted from the top surface of the SEL 20 and outputs electrical signals in proportion to the absorbed quantity of light.

In the operation of the conventional light emitting apparatus having this structure, some of the light emitted from the top surface of the SEL 20 is absorbed in the monitoring photodetector 50 and the rest of the light is transmitted and emitted through the window 29. Here, the emission of light in the light emitting apparatus is controlled to be constant by detecting the emitted quantity of light from the SEL 20 by means of the received quantity of light in the monitoring photodetector 50.

However, the light detected in the monitoring photodetector 50 includes some of the spontaneously emitted light as well as the stimulated emitted light. Thus, as the detection signals of this spontaneously emitted light have an effect on the detection signals of the monitoring photodetector 50, precise control of the amount of light emitted from the SEL 20 is difficult.

SUMMARY OF THE INVENTION

The object of the present invention is to provide a light emitting apparatus for precise control of the amount of light emitted from a surface emitting laser by blocking out most of the spontaneously emitted light moving toward a monitoring photodetector.

In order to achieve the latter object, a light emitting apparatus of the present invention comprises a surface emitting laser (SEL) for emitting light in a direction of the stacked layers and a monitoring photodetector stacked on the SEL to detect the emitted quantity of light by receiving some of the light emitted from the SEL.

The SEL includes a substrate, an active layer formed on the upper surface of the substrate and which produces light, first and second reflection layers formed on the bottom and top surfaces of the active layer, respectively, and which resonate the produced light by means of reflection, and first and second electrodes formed on the bottom surface of the substrate and a portion of the upper surface of the second reflection layer.

In order to receive and detect the amount of some of the light emitted from the SEL, the monitoring photodetector includes a first semiconductor material layer, an absorbing layer, and a second semiconductor material layer, which are stacked successively on the second reflection layer, and a third electrode which is formed on the second semiconductor material layer and which outputs a detecting signal.

According to the embodiment of the present invention, a controlling layer, which intercepts some of the incident light from the SEL, is formed on the bottom of the absorbing layer.

The controlling layer includes a transmission area formed at the center portion so as to transmit some of the incident light from the SEL and an interception area formed on the remaining area for blocking the incident light.

Most of the stimulated light emitted from the SEL is transmitted through the transmission area and most of the spontaneously emitted light from the SEL is blocked by the interception area.

DETAILED DESCRIPTION OF THE INVENTION

Figure 1:
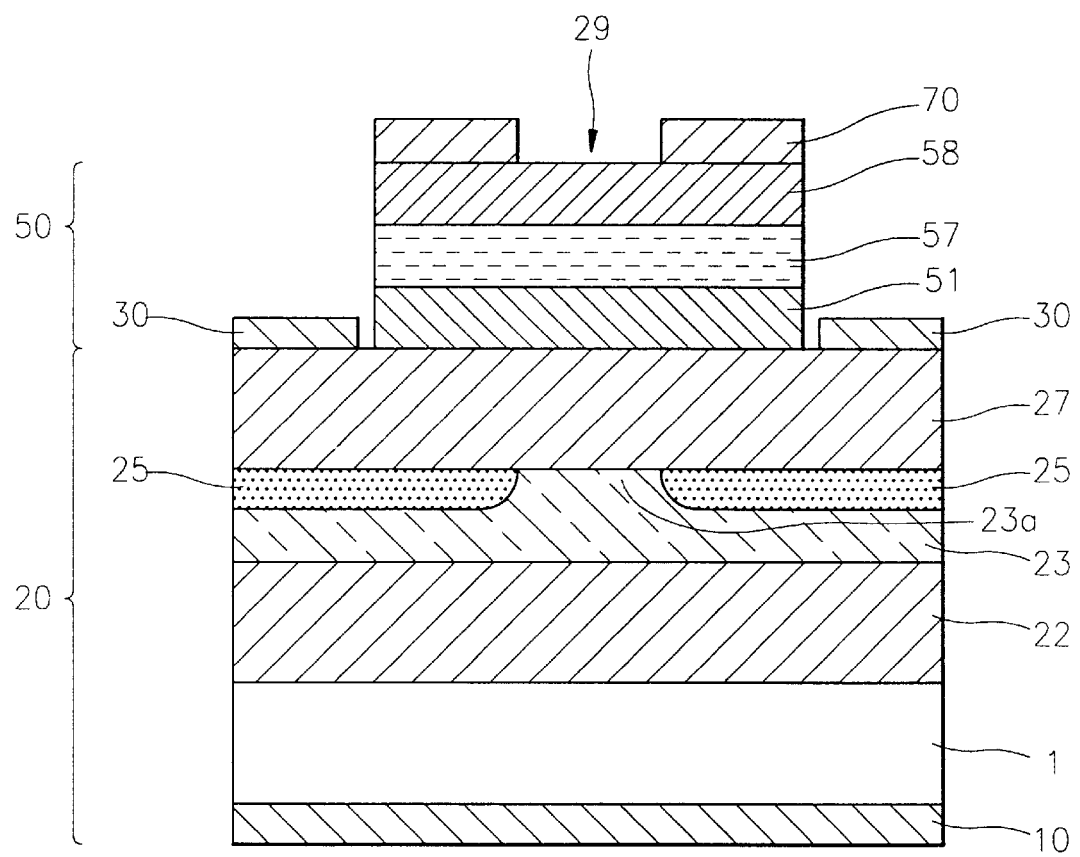
FIG. 1 is a cross sectional diagram schematically showing a conventional light emitting apparatus.
Figure 2:
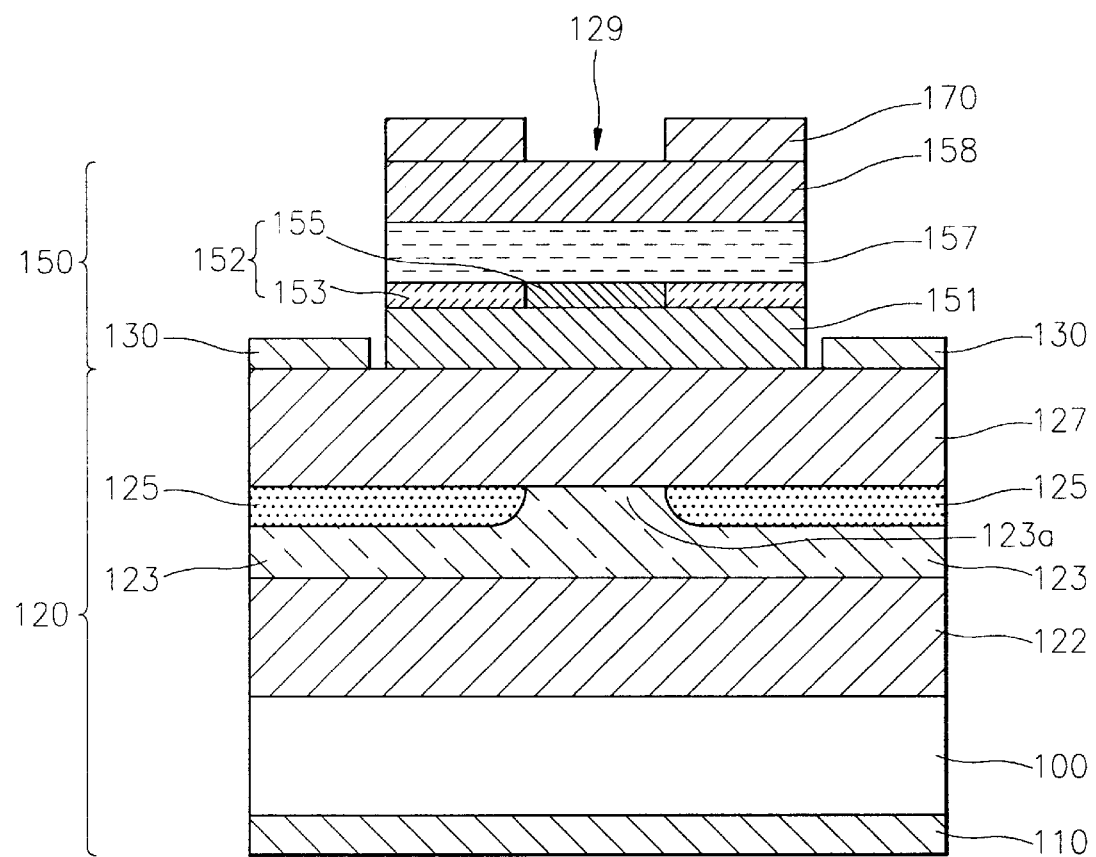
FIG. 2 is a cross sectional diagram schematically showing a light emitting apparatus according to an embodiment of the present invention.

As illustrated in FIG. 2, the light emitting apparatus according to the present invention includes a surface emitting laser (SEL) 120 for producing and emitting light in the direction of the stacked layers and a monitoring photodetector 150 formed on the SEL 120 for detecting the amount of light emitted from the SEL 120.

The SEL 120 includes a substrate 100, a first reflection layer 122, an active layer 123, a second reflection layer 127, stacked and formed successively on the substrate 100, and first and second electrodes 110 and 130 formed respectively on the lower surface of the substrate 100 and a portion of the upper surface of the second reflection layer 127.

It is desirable for the substrate 100 to be formed by doping n-type or p-type impurities into a semiconductor material such as gallium arsenide (GaAs) or produced by intrinsic semiconductor materials without impurities.

The first and second reflection layers 122 and 127 are different impurity type semiconductor layers. For example, the reflection layers 122 and 127 are formed by stacking two semiconductor compounds having different refractive indices, $Al_xGa_{1-x}As$ and GaAs, or $Al_xGa1_{1-x}As$ and $Al_yGa_{1-y}As$ ($x \neq y$) alternately. The reflection layers 122 and 127 provide the SEL 120 with electrons and positive holes due to the positive biasing from the first and second electrodes 110 and 130, and resonate the light produced from the SEL 120 by means of reflection.

The reflection layers 122 and 127 reflect most of the incident light and have a high reflective ratio so as to emit light of a specific wavelength. Here, the reflective ratios of the reflection layers 122 and 127 are decided by the number of pairs of the stacked semiconductor compounds. It is desirable that the first reflection layer 122 has a higher reflective ratio than the second reflection layer 127.

The active layer 123 is formed by stacking intrinsic semiconductor materials in the structure of single and multiple quantum wells, or in a superlattice structure. In the active layer 123, combining electrons with positive holes provided from the two reflection layers 122 and 127 by the positive biasing provided by the first and second electrodes 110 and 130 induces emission of light. It is desirable to further include a high resistance portion 125 which is formed by injecting ions or protons into the active layer 123 but not the center portion 123a of the surface of active layer 123 so that the applied electric current can be guided to the center portion 123a of the active layer 123.

The SEL 120 formed as described above emits stimulated emitted light to the top and the bottom surfaces as a result of the positive biasing provided by the first and second electrodes 110 and 130. The SEL 120 also emits spontaneously emitted light.

The monitoring photodetector 150 is formed of a first semiconductor material layer 151 stacked on the second reflection layer 127, a controlling layer 152 formed on the top surface of the first semiconductor material layer 151 for controlling the transmission area of the incident light, an absorbing layer 157 formed on the upper surface of the controlling layer 152, a second semiconductor material layer 158 formed on the upper surface of the absorbing layer 157, and a third electrode 170 for outputting detection signals of the monitoring photodetector 150.

The first and second semiconductor material layers 151 and 158 are layers doped with different type impurities, and the absorbing layer 157 is an intrinsic semiconductor material without impurities.

The third electrode 170 is formed on the second semiconductor material layer 158 to have an opening or window 129 for passing the light emitted from the SEL 120 through the window 129.

The controlling layer 152 includes a transmission area 155, formed in the center portion for transmitting light from the SEL 120, and an interception area 153, formed on the other areas of the controlling layer 152, for blocking the incident light. The controlling layer 152 is formed by stacking a light transmissive semiconductor material layer, such as AlAs, and then oxidizing the interception area 153, for example, to form AlAs oxide.

Light emitted from the upper surface of the SEL 120 is transmitted through the transmission area 155, part of the light is absorbed in the absorbing layer 157 of the monitoring photodetector 150, and the rest is emitted through the window 129. Light that is emitted from the upper surface of the SEL 120 and is incident on the interception area 153 is intercepted.

Since the transmission area 155 is located over the center portion 123a of the active layer 123, most of the stimulated emitted light emitted from the upper surface of the SEL 120 is emitted toward the transmission area 155. Meanwhile, most of the spontaneously emitted light, which is emitted from the upper surface of the SEL 120, is incident upon and intercepted by the interception area 153.

Although some of the spontaneously emitted light from the SEL 120 is transmitted through the transmission area 155 and is detected in the monitoring photodetector 150, it does not have any significant effect on the control of the amount of light emitted from the SEL 120, since the amount of spontaneously emitted light passing through transmission area 155 is negligible with respect to the stimulated emitted light.

Thus, as the detection signal of the monitoring photodetector 150 is proportional to the amount of the stimulated light emitted through the window 129, a change in the amount of light emitted through the window 129 can be detected by the monitoring photodetector 150. In addition, the amount of the light from the SEL 120 emitted through the window 129 can be controlled by controlling the electric current provided to the SEL 120 by means of feedback signals from the photodetector.

Therefore, the light emitting apparatus according to the present invention can monitor the stimulated emitted light proportional to the amount of light emitted through a window 129 by employing a monitoring photodetector 150 which has the controlling layer 152 which intercepts most of the spontaneous light emitted from the upper surface of the SEL 120.

In addition, the structure can be simplified by making the SEL 120 and the monitoring photodetector 150 of a single body.

What is claimed is:

1. A light emitting apparatus of the type having a surface emitting laser for emitting stimulated emitted light and spontaneously emitted light, and a monitoring photodetector for detecting the emitted light from said laser; said laser having a substrate, a first electrode on the lower surface of said substrate, a first reflection layer on said substrate, an active layer on said first reflection layer, a second reflection layer on said active layer, and a second electrode on said second reflection layer; and said photodetector having a first semiconductor material layer on said second reflection layer, an absorbing layer above said first semiconductor material layer; a second semiconductor material layer on said absorbing layer, and a third electrode on said second semiconductor material layer; the improvement comprising, a controlling layer formed on the lower surface of said absorbing layer for intercepting some of the incident light from said laser to thereby block mostly the spontaneously emitted light while passing mostly said stimulated emitted light.

2. A light emitting apparatus of claim 1, wherein said controlling layer comprises a transmission area formed at a center portion thereof to transmit the incident light thereon from said surface emitting laser, and an interception area formed on the remaining area of said controlling layer to block the light from said laser that is incident on said interception area.

3. A light emitting apparatus of claim 2, wherein said transmission area comprises a light transmissive semiconductor material, and said interception area is an oxidized portion of said latter semiconductor material.

4. A light emitting apparatus of claim 3, wherein said light transmissive semiconductor material comprises AlAs and said interception area comprises AlAs oxide.

5. A light emitting apparatus of claim 1, wherein said first semiconductor material layer and said second semiconductor material layer of said monitoring photodetector are doped with different type impurities, respectively, and said absorbing layer comprises an intrinsic semiconductor material.

6. A light emitting apparatus of claim 1, wherein said active layer comprises a high resistance portion formed in said active layer except at the center portion thereof for guiding the flow of electrons and positive holes provided by said first and second electrodes.

* * * * *